United States Patent
Storer et al.

(10) Patent No.: US 6,794,338 B2
(45) Date of Patent: Sep. 21, 2004

(54) ARTICLE WITH THERMOCHEMICALLY STABLE, AMORPHOUS LAYER COMPRISING TANTALUM OR TANTALUM-CONTAINING MATERIAL

(75) Inventors: Jonathan G. Storer, Mendota Heights, MN (US); Bruce C. Williams, Forest Lake, MN (US)

(73) Assignee: 3M Innovative Properties Company, Saint Paul, MN (US)

(*) Notice: Subject to any disclaimer, the term of this patent is extended or adjusted under 35 U.S.C. 154(b) by 389 days.

(21) Appl. No.: 09/991,229

(22) Filed: Nov. 16, 2001

(65) Prior Publication Data

US 2003/0094598 A1 May 22, 2003

(51) Int. Cl.⁷ .......................... H01B 12/00; H01F 6/00; H01L 39/00
(52) U.S. Cl. ................ 505/237; 505/238; 428/701; 428/702
(58) Field of Search ............................ 505/237, 238, 505/230; 428/699, 701, 702

(56) References Cited

U.S. PATENT DOCUMENTS

| | | | |
|---|---|---|---|
| 4,578,429 A | 3/1986 | Gergen et al. | |
| 4,609,697 A | 9/1986 | Albers | |
| 4,628,072 A | 12/1986 | Shiraki et al. | |
| 5,037,885 A | 8/1991 | Mori et al. | |
| 5,231,074 A | 7/1993 | Cima et al. | |
| 5,432,151 A | 7/1995 | Russo et al. | |
| 5,846,653 A | 12/1998 | Hawkins | |
| 5,972,847 A | 10/1999 | Feenstra et al. | |
| 6,261,704 B1 | 7/2001 | Paranthaman et al. | |

FOREIGN PATENT DOCUMENTS

| | | |
|---|---|---|
| EP | 0 338 631 A1 | 10/1989 |
| WO | WO 99/25908 | 5/1999 |
| WO | WO 01/15245 A1 | 3/2001 |
| WO | WO 01/26164 A2 | 4/2001 |

OTHER PUBLICATIONS

B. Schulte et al., "Compositional effects in $Y_xBa_yCu_zO_{7-\delta}$ thin films prepared by Metalorganic Chemical Vapor Deposition," *Appl. Phys Lett.* 62 (6), Feb. 8, 1993, pp. 633–635.

R. M. Bradley et al., "Theory of Thin–Film Orientation by Ion Bombardment During Deposition," *J. Appl. Phys.* 60 (12), Dec. 15, 1986, pp. 4160–4164.

S. R. Foltyn, "Pulsed Laser Deposition of Thick $YBa_2Cu_3O_{7\delta}$ films with $J_c°1$ $MA/cm^2$," *Appl. Phys. Lett.* 63 (13), Sep. 27, 1993, pp. 1848–1850.

P. Kofstad, "Nonstoichiometry, Diffusion, and Electrical Conductivity in Binary Metal Oxides", Robert E. Krieger Publ. Co., Malabar, Florida, 1983, pp. 193–194.

C. Kittel, "Introduction to Solid State Physics," Third Edition, John Wiley & Sons, Inc., New York, NY, pp. 21–24.

J. Vossen et al., ed., "Thin Film Processes," Academic Press, Inc., 1978, Chap. II–2, Sec. VIII, pp. 107–109.

(List continued on next page.)

*Primary Examiner*—M. Alexandra Elve
*Assistant Examiner*—Colleen P. Cooke
(74) *Attorney, Agent, or Firm*—Sean J. Edman

(57) ABSTRACT

Described is an article having a substrate; a thermochemically stable, amorphous layer comprising tantalum or a tantalum-containing material; a layer of material having a rock salt-like structure having substantial alignment both in-plane and out-of-plane; a superconducting layer formed on said rock salt-like layer having substantial in-plane and out-of-plane alignment; wherein said rock salt-like layer provides a template for the epitaxial growth of said superconducting layer; and an optional buffer layer or layers having substantial alignment both in-plane and out-of-plane, between the rock salt-like structure layer and the superconducting layer.

17 Claims, 1 Drawing Sheet

OTHER PUBLICATIONS

W. Sproul et al., "An Integrated Solution for Reactive Sputtering," *Vacuum & Coating Technology*, Aug. 2001, pp. 33–39.

M. Ohring, "The Materials Science of Thin Films," Academic Press, Inc., pp. 392–395, 406.

"Structure of Metals; Crystallographic Methods, Principles, and Data," McGraw–Hill, $3^{rd}$ ed., 1966, pp. 240–241.

R. De Reus et al. "Buffer Layers for Superconducting Y–Ba–Cu–O Thin Films on Silicon and Si $O^{2}$", *Materials Science and Engineering*, B7 pp. 135–147 (1990).

ARTICLE WITH THERMOCHEMICALLY STABLE, AMORPHOUS LAYER COMPRISING TANTALUM OR TANTALUM-CONTAINING MATERIAL

This invention was made with government support under Agreement N00014-98-3-0015 awarded by the Office of Naval Research. The government has license rights in the invention.

FIELD OF THE INVENTION

This invention relates generally to superconductive articles. More particularly, this invention relates to an article having a substrate, a thermochemically stable, amorphous layer comprising tantalum or a tantalum-containing material, a layer of material having a rock salt-like structure that has substantial alignment both in-plane and out-of-plane, a superconducting layer formed proximate said rock salt-like layer that has substantial in-plane and out-of-plane alignment, wherein said rock salt-like layer provides a template for the epitaxial growth of said superconducting layer, and an optional buffer layer or layers with substantial alignment both in-plane and out-of-plane, between the rock salt-like structure layer and the superconducting layer.

BACKGROUND OF THE INVENTION

Current research in the area of high temperature superconductivity includes the use of biaxially textured high temperature superconducting thin films. Most such high temperature superconducting thin films have been grown on single crystal substrates, which promote the growth of oriented epitaxial films. However, such single crystal substrates may not be suitable for all applications.

High temperature superconductive articles include, at least, a substrate and a superconducting layer (such as $YBa_2Cu_3O_{7-x}$ ("YBCO")) deposited thereon. One or more other layers are generally included between the substrate and the superconducting material. The purposes of these other layers are varied, but are, for example, to provide a biaxially textured template, to reduce or eliminate negative reactions between the superconducting material and the substrate and/or the template layer, and/or to protect another layer or layers of the article from adverse results of exposure to conditions, such as high temperature, that may be used to apply or treat subsequently applied layers. Ultimately, a crystallographically ordered superconductive layer is desired that can carry large currents without resistive loss.

Ion beam assisted deposition (IBAD) is used to produce biaxially textured films on non-epitaxial substrates that can subsequently be used as a structural template for the deposition of other films, thereby eliminating the requirement for single crystalline, biaxial substrates.

Yttria-stabilized zirconia (YSZ) can be applied to a substrate using IBAD, and provides a desired biaxial texture with desired crystallographic orientation. However, the desired texture of YSZ evolves slowly, so a thick film or layer is required to achieve good in-plane alignment. Due to its high processing time and cost, the application of YSZ to a substrate is not favored.

Materials that are characterized by rock salt-like structures, due to their simple crystal lattice, can be applied to crystallographically disordered substrates using IBAD to provide a good template for superconducting layers. These materials may be applied in thin layers, allowing them to be applied more quickly than YSZ.

Rock salt-like materials need a non-crystalline (amorphous) surface upon which to be coated to result in a coating having the preferred orientation. If the surface upon which the rock salt-like material is coated is not amorphous, but is polycrystalline or some other structure, the rock salt-like material will be predisposed to have the same structure as that surface and may result in a poor template upon which to ultimately coat a superconducting layer.

WO 99/25908 describes coating a layer of rock salt-like material on a substrate having an amorphous surface provided by a coating of $Si_3N_4$ or $SiO_2$ on the substrate.

The use of $Si_3N_4$ or $SiO_2$ as an amorphous layer in high temperature superconductive articles, however, is problematic. For example, the silicon atoms of $Si_3N_4$ or $SiO_2$ diffuse through subsequent buffer layers that are applied over the $Si_3N_4$ or $SiO_2$ and into the superconducting layer, and reduce the conductivity of the superconducting layer.

Thus, the need still exists for a substrate with an amorphous layer upon which a rock salt-like material, optional subsequent buffer layers, and, ultimately, a superconducting layer may be applied, and which results in the superconducting layer having good critical current capability.

SUMMARY OF THE INVENTION

The inventors recognized that a thermochemically stable, amorphous layer comprising tantalum or a tantalum-containing material coated on a polycrystalline substrate could act as a smoothing layer on the substrate that would provide an amorphous surface upon which to establish a rock salt-like material layer with a preferred biaxial texture. The rock salt-like layer then could serve as the template for epitaxial growth of subsequent layers, including a superconducting layer, which would ultimately have the desired orientation to result in good critical current densities.

The amorphous layer comprising tantalum or a tantalum-containing material also acts as a barrier between a metallic substrate and subsequently applied layers. The layer is a barrier specifically to cations that may migrate from the substrate to the rock salt-like layer, and that may affect the crystallographic orientation of the rock salt-like layer, which would ultimately negatively affect the critical current density of the superconducting layer.

The inventors also recognized that since tantalum has an extremely slow diffusion rate through some other materials and since tantalum ions are relatively large in size, cations of tantalum would not migrate in sufficient amounts to adversely affect the crystallographic ordering of the rock salt-like material that is applied over the layer comprising tantalum or a tantalum-containing material nor would they significantly diffuse into the superconducting layer to adversely affect the conductivity of the superconducting layer.

The present invention provides an article comprising: a) a substrate having at least one major surface; b) a thermochemically stable, amorphous layer comprising tantalum or a tantalum-containing material, wherein said thermochemically stable, amorphous layer is formed on at least one major surface of said substrate; c) a layer of material having a rock salt-like structure formed on said thermochemically stable, amorphous layer and that has substantial alignment both in-plane and out-of-plane; and d) a superconducting layer having substantial in-plane and out-of-plane alignment that is formed proximate said rock salt-like layer; wherein said rock salt-like layer provides a template for epitaxial growth of said superconducting layer.

The article may further comprise at least one buffer layer between said rock-salt like layer and said superconducting layer, wherein said at least one buffer layer substantially replicates the template provided by said rock salt-like layer.

The article may further comprise a protective layer applied on said superconducting layer.

As used herein:

"Amorphous" means substantially lacking crystalline structure as indicated by X-ray diffraction;

"Biaxial texture" means that the crystallites in a layer are substantially aligned with both a direction perpendicular to the surface of the layer and a direction in the plane of the layer;

"Biaxial layer" means a layer of material having biaxial texture;

"Crystallite" means that portion of a crystal whose constituent atoms, ions, or molecules form a perfect lattice, without strains or other imperfections. Single crystals may be quite large, but crystallites are usually microscopic;

"Epitaxial growth" means that the crystallographic orientation of the layers applied subsequent to a biaxial layer (the rock salt-like layer in this case) is derived from and directly relates to the crystallographic orientation of the biaxial layer and/or of the intermediate layer that is based on the template provided by the biaxial layer;

"In-plane" describes the direction that is substantially parallel to the plane of the article or layer;

"Out-of-plane" describes the direction that is substantially perpendicular to the plane of the article or layer;

"Rock salt-like" refers to a crystalline structure with atomic arrangements identical to or similar to that in rock salt, such as cubic structures with (100) close-packed planes or cubic structures in which a part of the lattice (some planes) have the same atomic arrangement as in rock salt, and means a structure having a cF8 Pearson symbol and a B1 Sturrukturbericht designation; and, "Thermochemically stable" means that the material or layer of material itself does not substantially react with adjacent or nearby materials or layers, and that it is stable to temperatures of up to about 950 degrees Celsius.

BRIEF DESCRIPTION OF THE DRAWINGS

The invention may be more completely understood in consideration of the following detailed description of various embodiments of the invention in connection with the accompanying drawing, in which.

DETAILED DESCRIPTION OF THE INVENTION

Figure 1:
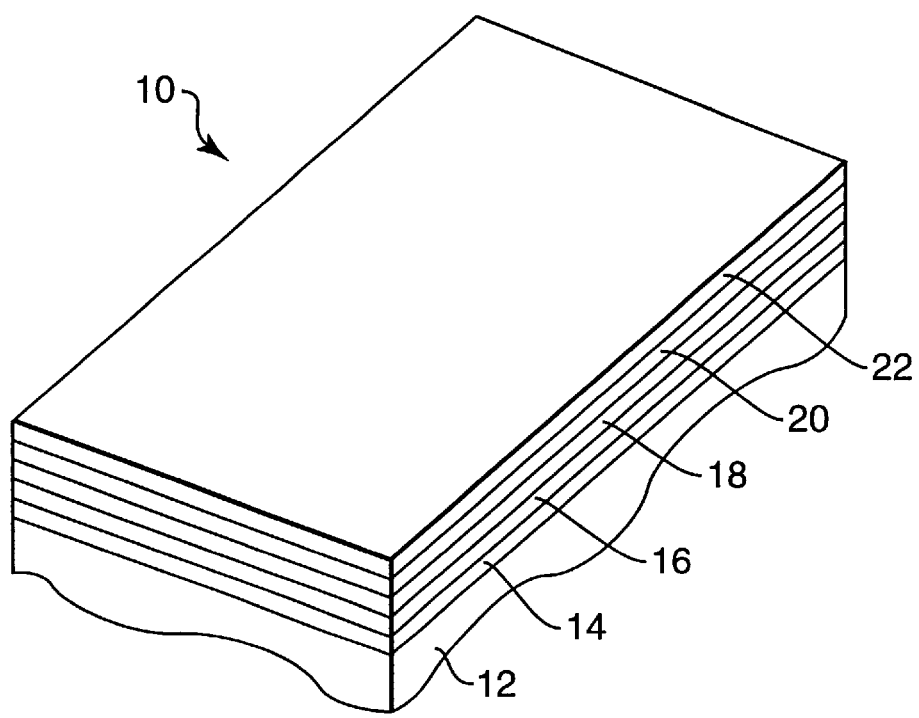
FIG. 1 is a schematic drawing (not to scale) of an embodiment of the present inventive article.

As shown in FIG. 1, an embodiment of the present invention is an article 10 that comprises: a) a substrate 12 having at least one major surface; b) a thermochemically stable, amorphous layer 14 comprising tantalum or a tantalum-containing material formed on at least one major surface of said substrate 12; c) a layer of material having a rock salt-like structure 16 formed on said amorphous layer 14 and that has substantial alignment both in-plane and out-of-plane; d) an optional buffer layer or layers 18 on said rock salt-like layer 16, wherein said rock salt-like layer 16 provides a template for epitaxial growth of said buffer layer or layers 18; e) a superconducting layer 20 formed on said rock salt-like layer 16 or on said optional buffer layer or layers 18 that has substantial in-plane and out-of-plane alignment, wherein said rock salt-like layer 16 provides a template for epitaxial growth of said superconducting layer 20; and f) and an optional protective layer 22.

Substrate

Substrate 10 may comprise any suitable material to which a thermochemically stable, amorphous layer comprising tantalum or a tantalum-containing material will adhere. Suitable substrate materials may include any amorphous or polycrystalline [material that is oxidation resistant when exposed to temperatures up to about 700° C. or more. Preferably, the substrate material will have a thermoexpansion coefficient that is similar to the thermoexpansion coefficients of the layers of materials that further comprise the inventive article.

Preferably, the substrate 10 will comprise a metal substrate. An exemplary metal substrate may comprise a nickel-based superalloy such an INCONEL™ alloy (available from International Nickel Inc., Saddle Brook, N.J.), or a HASTALLOY™ alloy (available from Haynes International, Inc., Kokomo, Ind.). Another material that may be used is stainless steel. Most preferably, however, the substrate comprises a nickel-containing material.

Preferred metal substrates of the present invention are those that provide a flexible support. Preferably, the metal is in the form of a foil. A "foil" is a thin, flexible sheet of metal. Foils of preferred alloys are oxidation resistant, have high strength, are non-ferromagnetic, and are readily obtained as standard products in many thicknesses and widths. Preferably the metal foil is about 0.025 millimeters (mm) to about 0.127 mm thick and about 1 centimeter (cm) to about 1 meter (m) wide. An advantage of using these foils is that they are inexpensive, oxidation resistant, have similar thermal expansion coefficients to the other materials of the article, and can be made with extremely smooth surfaces.

The substrate may be polished using chemical-mechanical polishing (CMP) or may be used as-rolled. It is preferred that the substrate have a root mean square (RMS) surface roughness that is about 1 nm to about 6 nm.

Thermochemically Stable, Amorphous Layer

The thermochemically stable, amorphous layer of the present inventive article comprising tantalum and/or a tantalum-containing material is formed on at least one major surface of a substrate. The tantalum-containing material may comprise tantalum oxide or tantalum nitride, for examples.

A preferred thermochemically stable, amorphous layer comprises tantalum oxide. Tantalum oxide is non-crystalline (i.e. amorphous) and is stable at temperatures up to about 950 degrees Celsius. Preferred is $TaO_x$, where x is $5/2\pm1$. Tantalum pentoxide, $Ta_2O_5$, and several metastable suboxides are formed in oxidation reactions, and will be present when tantalum oxide is used as the thermochemically stable, amorphous layer. See, "Nonstoichiometry, Diffusion, and Electrical Conductivity in Binary Metal Oxides," by Per Kofstad, Robert E. Krieger Publ. Co., Malabar, Fla., 1983, pp. 193–194 (which is incorporated by reference).

The preferred tantalum nitrides are TaN, and $TaN_x$ where x=0.5–2.0.

The thermochemically stable, amorphous layer is preferably applied to the substrate using reactive sputtering using the "DC mode" in an oxygen and argon ambient. (For a description of reactive sputtering, see: "Thin Film Processes," edited by Vossen and Kern, Academic Press, 1978, Chap. II-2, Sec. VIII, pp. 107–109 (which is herein incorporated by reference); and, "An Integrated Solution for Reactive Sputtering," by Sproul et al., Vacuum & Coating Technology, August 2001, pp. 33–39 (which is also herein incorporated by reference)). It may also be applied using evaporation or RF reactive sputtering. However, it is advantageous to use DC mode reactive sputtering because it allows for faster and more economical deposition.

The thermochemically stable, amorphous layer of the present inventive article serves at least two purposes. One purpose is that the layer acts as a suitable amorphous surface for the growth of rock salt-like material, as taught in WO 99/25908 (which is incorporated herein by reference). The second purpose is that the layer acts as a diffusion barrier by substantially limiting or preventing the diffusion of cations from the substrate and into the subsequently applied layers. Such diffusion is particularly likely to occur when subsequent layers are exposed to high temperatures, e.g. temperatures of up to about 950 degrees Celsius. Cations that migrate or diffuse from other layers into the superconducting layer may have a deleterious effect on the superconducting properties of the superconducting layer. A third purpose of the layer is that it is thermochemically stable, and the layer does not produce more than an insignificant number of cations that will migrate into the subsequently applied layers, which migration could also negatively affect the superconducting properties of the superconducting layer.

Rock Salt-Like Layer

The layer of material having a rock salt-like structure of the present inventive article is formed on said thermochemically stable, amorphous layer and has substantial alignment both in-plane and out-of-plane. The rock salt-like layer provides biaxial texture to the inventive article. Biaxial texturing allows for epitaxial growth of the biaxial texture which will ultimately produce biaxial texture in the superconducting layer that will result in high current densities in the superconducting layer.

Typical rock salt-like materials (which include rock salt materials themselves) are described, for example, by "Metals Handbook, Ninth Edition", volume 9, pp. 707–711, which pages are herein incorporated in their entirety by reference, and by C. S. Barrett and T. B. Massalski, "Structure of Metals", McGraw-Hill, $3^{rd}$ edition, 1966, pp. 240–241, which pages are herein incorporated in their entirety by reference.

Suitable rock salt-like materials are oxides, and preferably include CaO, SrO, TiN, ZrO, BaO, and MgO. The preferred rock salt-like for the present invention is MgO.

Materials characterized by rock salt-like structures are used in the present invention as templates for forming well-textured layers of superconducting films due to their simple crystal lattice, which tends to naturally align with a preferred surface for subsequent growth of textured films.

The rock salt-like layer of the present invention is preferably applied using IBAD. (See U.S. Pat. No. 5,432,151 for method of applying biaxially aligned layer using IBAD, which is herein incorporated by reference). However, it may be possible to use other methods, such as reactive sputtering and pulsed laser deposition.

In order to apply the rock salt-like layer by IBAD, an ion beam from an ion source is first projected onto the surface upon which the rock salt-like material is to be applied at an angle a with respect to the surface normal. An example of an ion source that can be used is a multi-aperture ion source (such as the Kaufman ion source by Ion Tech, Inc., Fort Collins, Colo.). The ion energy is preferably between about 200 and about 1200 electron Volts (eV). Most preferably, the ion energy is about 800 eV. The ion beam angle divergence is preferably between about 0° and about 30°. The temperature is preferably about room temperature (RT) to about 200° C. The thickness of the rock salt-like material layer is preferably about 8 nanometers (nm) to about 15 nm, and most preferably about 9 nm to about 10 nm.

The purpose of IBAD is to provide desired in-plane crystallographic texture, as described in "Theory of Thin-Film Orientation by Ion Bombardment During Deposition," by R. Mark Bradley, et al., J. Appl. Phys. 60 (12), Dec. 15, 1986 (which is incorporated herein by reference).

The diffraction pattern of the rock salt-like material can be monitored in real time using a reflection energy diffraction apparatus (RHEED) which projects a RHEED beam onto the deposition surface. (Available from STAIB Instruments, Inc., Virginia). A Faraday cup and quartz crystal monitor (both available from Leybold Inficon, East Syracuse, N.Y.) are used to monitor the ion flux and evaporation rate of the material being deposited.

The crystallites of the rock salt-like material are desired to grow in pseudo-columns with each column consisting of small three-dimensional crystallites with the alignment of the crystallites starting at the interface of the thermochemically stable, amorphous layer and the rock salt-like layer.

Besides providing the template for epitaxial growth of said superconducting layer, the rock salt-like layer, depending upon what it comprises, may be capable of preventing or inhibiting migration of materials from the substrate through and into the superconducting layer. Such migration of materials from the substrate to the superconducting layer could destroy or interfere with the superconducting properties of the superconducting layer.

Both the in-plane and out-of-plane crystallographic orientations of the crystallites of the rock salt-like material layer are important to this invention. The orientations can be measured using X-ray diffraction (XRD). Such measurement techniques are described in Elements of X-ray Diffraction, by Bernard Dennis Cullity, Addision-Wesley Publ. Co., Reading, Mass., 1957, which is incorporated herein by reference. The crystallites are desired to have certain in-plane and out-of-plane orientations. The numerical representation of such crystallographic orientations is known as a Miller index. (See Material Crystal Chemistry, by Relva Buchanan and Tauen Park, Marcel Dekker, Inc., 1997, Chap. 2, which is incorporated herein by reference).

The desired out-of-plane orientation of at least a substantial amount of the crystallites of the rock salt-like material is (200). The desired in-plane orientation is any orientation as long as at least a substantial amount of the crystallites have the same or nearly the same in-plane orientation. In particular, a substantial amount of the crystallites are desired to be nearly parallel such that the distribution of crystallites shown in a Gaussian distribution will have a full-width-half-maximum (FWHM) that is less than about 20 degrees, and preferably less than about 10 degrees.

Optional Buffer Layers

It may be desirable to have at least one buffer layer 18 between the rock salt-like layer 16 and the superconducting layer 20 of the present invention. Suitable materials to use as buffer layers must be able to substantially replicate the template that was established by the rock salt-like material layer, and thereby provide epitaxial growth. In addition, these buffer layers will preferably be diffusion barriers to migrating materials and/or ions in the inventive article.

Some exemplary buffer materials include, but are not limited to, yttria-stabilized zirconia (YSZ), cerium oxides (such as $CeO_2$), yttrium oxides (such as $Y_2O_3$), other rare earth oxides, and combinations thereof. The preferred buffer material is YSZ.

The optional buffer layer or layers may be applied over the rock salt-like layer using electron beam evaporation, pulsed laser deposition, sputtering, or chemical vapor deposition, for examples. The preferred method of applying the optional buffer layer or layers is by electron beam evaporation because of a desire for speed in deposition.

The purpose of at least one buffer layer may be to prevent or inhibit interdiffusion of materials (such as cations) between the substrate and the superconducting layer. Another possible purpose of such a buffer layer may be to protect the previously applied layers from conditions, such as high temperature, that may be used to apply or treat subsequently applied layers in the inventive article.

Superconducting Layer

The superconducting layer 20 of the present inventive article may be formed on the rock salt-like layer 16, or on an optional buffer layer or layers 18 that is/are coated over the rock salt-like layer 16.

The term "superconducting layer" means a layer of a superconducting material such as, by way of illustration and not of limitation, the superconducting ceramic materials sometimes referred to as 1-2-3 compounds because of the atomic ratios of 1 atom of an element such as a rare earth (Lanthanum series) element, e.g., lanthanum or yttrium; 2 atoms of another element such as an alkaline earth metal, e.g. barium or strontium; and 3 atoms of a metal such as copper. The superconducting ceramic also contains between 6 and 7 atoms of oxygen which may be referred to as $O_{(7-x)}$ where x is greater than 0.05 and less than 0.5, resulting in a chemical formula such as, for example, $Re_1Ba_2Cu_3O_{(7-x)}$. "Re" stand for a rare earth element. Other such superconducting ceramic materials include bismuth-strontium-calcium-copper oxides, thallium-calcium-barium-copper oxides, bismuth-lead-strontium-copper oxides, and thallium-calcium-barium-lead-copper oxides. Usually such superconducting films as described above are formed to a thickness from about 120 nm to about 1,000 nm. However, even thicker layers, up to as high as 5 micrometers or higher, are possible and may be necessary in some applications.

The superconducting layer of the present invention preferably comprises yttrium-barium-copper oxide (YBCO).

The superconducting layer may be applied in a manner taught in U.S. Pat. No. 5,972,847 (Feenstra et al.) (which is incorporated herein by reference). There are other methods that may be used to deposit the material, however, such as by metal organic deposition (MOD) (as described in U.S. Pat. No. 5,231,074 (Cima et al.), which is incorporated herein by reference), pulsed laser deposition (as described in "Pulsed Laser Deposition of Thick $YBa_2Cu_3O_{7-\delta}$ with $J_c$>1 $MA/cm^2$", by S. R. Foltyn et al., Appl. Phys. Lett. 63 (13), Sep. 27, 1993, which is incorporated herein by reference), or chemical vapor deposition (as described in "Compositional Effects in $Y_xBa_yCu_zO_{7-\delta}$ Thin Films Prepared by Metalorganic Chemical Vapor Deposition," by B. Schulte et al., Appl. Phys. Lett. 62 (6), Feb. 8, 1993, which is incorporated herein by reference), for examples.

High critical current densities ($J_c$), representing good superconductivity, are obtained for superconducting films that are oriented with a high degree of both in-plane and out-of-plane crystalline texture. The crystalline orientation of the superconducting layer is dependent upon the template that is established by the rock salt-like layer 16 in the present inventive article. The desired out-of-plane orientation for the superconducting layer is also (200). The desired in-plane orientation is any orientation as long as a substantial amount of the crystallites of superconducting material have the same or nearly the same in-plane orientation.

It is possible for more than one superconducting layer to be applied. For example, a superconducting layer can be formed and then thermally and/or chemically conditioned. An additional superconducting layer can then be formed on the conditioned surface of the first superconducting layer. The process can also be repeated to add additional layers, if desired.

Optional Protective Layer

The superconducting layer may optionally be coated with a protective layer 22, such as of silver (Ag), for example, to protect the superconducting layer 20 from adverse degradation reactions. The protective layer may comprise any suitable material that is known to those in the art. The layer may be applied in any suitable manner known to those in the art.

EXAMPLES

The present invention is further illustrated, but is not meant to be limited by, the following Examples, which include both actual and prophetic examples.

Testing Procedures

The following tests either have been or may be used to evaluate the inventive article, or layers of the inventive article.

Critical Current Density

Critical current density ($J_c$) of a superconductive article, comprising a substrate, a thermochemically stable, amorphous layer, a rock salt-like layer, optional buffer layers, a superconductive layer and an optional protective layer, applied in that order, can be determined by measuring the current that results in a voltage difference of at least 1 microvolt per cm ($\mu V/cm$) at the temperature of boiling liquid nitrogen (77° K.) on the surface of the superconducting layer or the protective layer thereon.

To measure the $J_c$, a sample of the superconductive article would be placed in liquid nitrogen. Buffer layers would have been previously applied to the rock salt-like layer, which would have been applied over the thermochemically stable, amorphous layer comprising tantalum. Then a superconducting layer, YBCO preferably, and an optional protective layer of silver would have been applied over the buffer layer or layers. A four-point probe could be used in conjunction with a constant current source and a millivolt electrometer to measure conductance of the superconducting layer. Each probe point could be spaced about 10 mm apart in contact with the surface of the article. Current could be increased until a drop in voltage occurs that is at least 1.0 $\mu V/cm$. The current at that point would be divided by the cross-sectional area (thickness x width) of the superconducting layer, and that would provide the critical current density of the superconducting layer in megaAmps per square centimeter ($MA/cm^2$).

A desirable critical current density would be above about 1 $MA/cm^2$.

Out-of-Plane Rotation

The out-of-plane orientation of the rock salt-like layer was determined using X-ray diffraction (XRD). Samples were measured as made or were cut to about 10 mm×20 mm and placed in a Phillips Vertical X-ray diffractometer (available from Phillips, Eindhoven, Netherlands) that measured a sample area having about a 3 mm diameter. Background noise was determined by measuring the counting rate of the X-ray diffractometer when it was set to an angle away from any diffraction peak. Then X-ray diffraction intensities of both (200) crystallographic orientation and (111) crystallographic orientation were measured. The sample has a crystallographically texture out-of-plane orientation if only the (200) signal is observed.

In-Plane Rotation

The in-plane rotation of crystallites in a layer (preferably a layer of MgO) of the inventive article could be determined by measuring the XRD intensity of the desired crystallographic orientation with the incident X-ray beam in close alignment with that orientation. By slightly changing the angle of incidence of the X-ray beam, the in-plane alignment could be measured. In effect, the in-plane rotation establishes the quality of the orientation by measuring the spread or misalignment of the orientation axis.

Samples could be cut to about 10 mm×20 mm and placed in an X-ray diffractometer that measures the area of an X-ray beam having about 3 mm diameter. X-ray scans would be made and results would show displays illustrating populations of count rates with averages.

The sample was placed in a Picker 4-circle X-ray diffractometer with the theta angle set to reflect the (200) peak. For the rock salt-like layer, for example (MgO), the angle is 62.30 degrees. The chi angle is rotated 45 degrees in the vertical direction, then the sample is rotated 360 degrees in the phi direction. The FWHM of any one of the four intensity peaks is measured. The FWHM is preferably less than 20 degrees and more preferably less than 10 degrees.

Example 1

The amorphous properties of a thermochemically stable, amorphous layer comprising tantalum were examined.

$TaO_x$ (hereinafter, in these Examples, referred to as tantalum oxide) was used for the thermochemically stable, amorphous layer. A metal substrate made of nickel and chromium (super alloy available as C276, 50 microns thick, from Hamilton Precision Metals, Lancaster, Pa.) was polished using chemical-mechanical polishing (CMP) using a 5 micron, then a 1 micron diamond abrasive, and placed within a movable cart in a vacuum chamber. The chamber was pumped down to 0.47 mPa (3.5E-3 mTorr) and backfilled with an argon-oxygen mixture to 127 mPa (0.957 mTorr). The mixture was formed from an argon flow of 90.0 standard cubic centimeters per minute (sccm) and an oxygen flow of 98.7 sccm. Tantalum (99.999% pure available from Target Materials, Inc., Columbus, Ohio) was sputter deposited in the presence of oxygen with a DC magnetron (Model 5 in.×12 in. planar available from Sierra Applied Sciences, Boulder, Colo.) at 489 V with 1000 W for 60 seconds to form a layer of tantalum oxide with a thickness of about 10 nm.

Next the sample was evaluated for suitability as a substrate for a textured rock salt-like layer, which would be coated using ion beam assisted deposition techniques, as described in WO 99/25908. No X-ray peaks were observed, which demonstrated that the tantalum oxide was amorphous. The magnesium oxide (referred to as MgO) was applied over the tantalum oxide layer without breaking vacuum. An argon ion beam (from an Ion Tech 2.5×22 linear gun powered by an Ion Tech MPS5000 supply, both available from Ion Tech Corp., Fort Collins, Colo.) was impinged onto the surface of the tantalum oxide layer for 5 seconds in the absence of MgO vapor. The ion beam was set to impinge at an angle of 45 degrees to the sample surface and was generated with an energy of 750 eV, current of 16 mA and a probe current of 9 $\mu A$. The ion current was measured using a Langmuir probe biased to −90 V. Then MgO (available at 99.999 wt % purity from Cerac Corp., Milwaukee, Wis.) was evaporated with an electron beam and deposited onto the surface of the tantalum oxide layer while the ion beam continued to impinge the surface. A partial pressure of oxygen was maintained at 1.1 mPa (0.008 mTorr) with an oxygen flow rate of 0.8 sccm to fully oxidize the MgO. The electron beam was operated at a voltage of 10 kV, a current of 0.45 A and a power of 4.5 KW. Deposition rate was between 0.15 and 0.20 nm/sec and the total MgO thickness was 10 nm. The sample was removed from the vacuum chamber and the MgO layer was tested for out-of-plane rotation. The MgO layer was crystallographically textured. A MgO (200) Bragg reflection was seen near 43 degrees in the 2 theta plot. No evidence of a (111) peak was seen.

Example 2

The sample from Example 1 could then be placed back in the vacuum chamber and yttria stabilized zirconia (YSZ) (available from Cerac Corp., Milwaukee, Wis.) could be next applied using electron beam evaporation with a voltage of 10 KV at 0.3 Amps of filament current. The sample would be heated to 800 degrees Celsius using an infrared lamp and reflector assembly from Research Inc., Eden Prairie, Minn. A partial pressure of oxygen could be maintained at 1.1 mPa (0.008 mTorr) with an oxygen flow rate of 0.8 sccm to fully oxidize the YSZ. The deposition rate could be between 0.2 and 1 nm/sec resulting in a YSZ layer thickness of about 160 nm.

The orientation of the TaO/MgO/YSZ layered substrate would then be measured for crystalline alignment before being used as a template for a superconducting layer. The out-of-plane and in-plane measurements would have to indicate a sufficiently textured (200) alignment for the superconducting layer to be optimized for maximum current carrying capacity. An in-plane rotational measurement (phi scan) would show peaks with a FWHM of at most 20 degrees, which would indicate a sufficient in-plane orientation.

Example 3

If the layered substrate described in Example 2 had the proper in-plane and out-of-plane orientations, YBCO could then be epitaxially deposited on the YSZ layer in a manner taught in U.S. Pat. No. 5,972,847, which is incorporated herein by reference. YBCO precursors would be deposited and the layer would be subsequently oxidized. That construction could be then coated with silver (Ag) to protect the YBCO layer from adverse degradation reactions in a manner similar to those known to the art. Following deposition of silver, the construction would be evaluated for conductivity. The critical current density ($J_c$) would be above about 1 $MA/cm^2$.

Comparative Example 1

Comparative Example 1 would be made in a manner similar to the Examples above except silicon nitride (referred to as SiN) (available from International Wafer Co., Portola Valley, Calif.) would be applied in place of tantalum oxide. SiN would be e-beam evaporated instead of DC magnetron sputtered. The deposition rate would be 1 nm/sec instead of 10 nm/sec. An argon/nitrogen gas mixture would be used instead of an argon/oxygen mixture. The total pressure in the chamber would be approximately 133 mPa (1 mTorr) with the partial pressure of nitrogen adequate to form SiN. The metal substrate would be at ambient temperature. The resulting thickness of the layer of SiN would be between about 10 and about 20 nm.

The sample would be removed from the vacuum chamber after MgO application and the MgO layer would be tested for out-of-plane rotation.

The sample would be tested for out-of-plane rotation again after the YSZ layer was applied. In-plane orientation would also be evaluated.

Following deposition of a YBCO layer at a thickness of about 300 nm and a silver layer, the critical current density ($J_c$) would be measured and it would be expected that the silicon cations from the silicon nitride layer, which is not thermochemically stable, diffused into the superconducting layer, or YBCO layer, thereby diminishing the superconductivity of the superconducting layer.

What is claimed is:

1. An article comprising:
   a. a substrate having at least one major surface;
   b. a thermochemically stable, amorphous layer comprising tantalum or a tantalum-containing material, wherein said thermochemically stable, amorphous layer is formed on at least one major surface of said substrate;
   c. a layer of material having a rock salt-like structure formed on said thermochemically stable, amorphous layer and having substantial alignment both in-plane and out-of-plane; and
   d. a superconducting layer having substantial in-plane and out-of-plane alignment that is formed proximate said rock salt-like layer;
   wherein said rock salt-like layer provides a template for epitaxial growth of said superconducting layer.

2. The article of claim 1 wherein said substrate comprises any suitable material to which the thermochemically stable, amorphous layer will adhere.

3. The article of claim 1 wherein said substrate comprises a nickel-containing material.

4. The article of claim 1 wherein said thermochemically stable, amorphous layer comprises tantalum oxide.

5. The article of claim 1 wherein said rock salt-like material is an oxide.

6. The article of claim 5 wherein said oxide is MgO.

7. The article of claim 1 wherein said superconducting layer comprises $YBa_2Cu_3O_{7-x}$.

8. The article of claim 1 further comprising at least one buffer layer between said rock salt-like layer and said superconducting layer, wherein said at least one buffer layer substantially replicates the template provided by said rock salt-like layer.

9. The article of claim 8 wherein said at least one buffer layer is independently selected from the group consisting of yttria-stabilized zirconia, cerium oxides, yttrium oxides, rare earth oxides, and combinations thereof.

10. The article of claim 8 further comprising a protective layer applied on said superconducting layer.

11. The article of claim 1 further comprising a protective layer applied on said superconducting layer.

12. The article of claim 11 wherein said protective layer comprises silver.

13. The article of claim 1 further comprising at least one more superconducting layer applied on said first superconducting layer.

14. An article comprising:
   a. a substrate comprising a nickel-containing material wherein said substrate has at least one major surface;
   b. a thermochemically stable, amorphous layer comprising tantalum oxide, wherein said thermochemically stable, amorphous layer is formed on at least one major surface of said substrate;
   c. a layer of material having a rock salt-like structure formed on said thermochemically stable, amorphous layer and having substantial alignment both in-plane and out-of-plane, wherein said rock salt-like material comprises magnesium oxide; and
   d. a superconducting layer comprising $YBa_2Cu_3O_{7-x}$ having substantial in-plane and out-of-plane alignment that is formed proximate said rock salt-like layer;
   wherein said rock salt-like layer provides a template for epitaxial growth of said superconducting layer.

15. The article of claim 14 further comprising at least one buffer layer between said rock-salt like layer and said superconducting layer, wherein said at least one buffer layer substantially replicates the template provided by said rock salt-like layer, and wherein said at least one buffer layer comprises yttria-stabilized zirconia.

16. The article of claim 14 further comprising a protective layer applied on said superconducting layer, wherein said protective layer comprises silver.

17. The article of claim 1 further comprising a protective layer applied on said superconducting layer, wherein said protective layer comprises silver.

* * * * *